(12) United States Patent
Shu et al.

(10) Patent No.: US 10,593,757 B2
(45) Date of Patent: Mar. 17, 2020

(54) INTEGRATED CIRCUITS HAVING CONVERTED SELF-ALIGNED EPITAXIAL ETCH STOP

(71) Applicant: GLOBALFOUNDRIES INC., Grand Cayman (KY)

(72) Inventors: Jiehui Shu, Clifton Park, NY (US); Ruilong Xie, Schenectady, NY (US); Hui Zang, Guilderland, NY (US); Haiting Wang, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 5 days.

(21) Appl. No.: 15/961,912

(22) Filed: Apr. 25, 2018

(65) Prior Publication Data

US 2019/0333993 A1 Oct. 31, 2019

(51) Int. Cl.
| | |
|---|---|
| *H01L 29/08* | (2006.01) |
| *H01L 29/78* | (2006.01) |
| *C30B 29/40* | (2006.01) |
| *H01L 29/66* | (2006.01) |
| *H01L 21/02* | (2006.01) |
| *C30B 25/04* | (2006.01) |

(52) U.S. Cl.
CPC .......... *H01L 29/0847* (2013.01); *C30B 25/04* (2013.01); *C30B 29/403* (2013.01); *H01L 21/0237* (2013.01); *H01L 21/0254* (2013.01); *H01L 21/02458* (2013.01); *H01L 21/02639* (2013.01); *H01L 29/66545* (2013.01); *H01L 29/66628* (2013.01); *H01L 29/785* (2013.01)

(58) Field of Classification Search
CPC ............ H01L 29/0847; H01L 21/0237; H01L 21/02639; H01L 21/0254; H01L 29/785; H01L 29/66545; H01L 29/66628; H01L 21/02458; C30B 25/04; C30B 29/403
See application file for complete search history.

(56) References Cited

U.S. PATENT DOCUMENTS

| | | | |
|---|---|---|---|
| 6,087,235 | A | 7/2000 | Yu |
| 7,727,332 | B2 | 6/2010 | Habel et al. |
| 8,445,940 | B2 | 5/2013 | Tsai et al. |
| 9,337,306 | B2 | 5/2016 | Peng et al. |
| 9,608,062 | B1 * | 3/2017 | Tseng .................. H01L 29/0653 |
| 2005/0145865 | A1 | 7/2005 | Okuyama et al. |
| 2013/0045594 | A1 | 2/2013 | Wang et al. |
| 2015/0228776 | A1 | 8/2015 | Xie |
| 2016/0148933 | A1 * | 5/2016 | Cheng ................. H01L 29/7848 257/369 |

* cited by examiner

*Primary Examiner* — Steven H Loke
*Assistant Examiner* — Juanita B Rhodes
(74) *Attorney, Agent, or Firm* — Gibb & Riley, LLC; Francois Pagette

(57) ABSTRACT

Methods form an integrated circuit structure that includes complementary transistors on a first layer. An isolation structure is between the complementary transistors. Each of the complementary transistors includes source/drain regions and a gate conductor between the source/drain regions, and insulating spacers are between the gate conductor and the source/drain regions in each of the complementary transistors. With these methods and structures, an etch stop layer is formed only on the source/drain regions.

17 Claims, 6 Drawing Sheets

INTEGRATED CIRCUITS HAVING CONVERTED SELF-ALIGNED EPITAXIAL ETCH STOP

BACKGROUND

Field of the Invention

The present disclosure relates to integrated circuit structures, and more specifically, to those including a self-aligned epitaxial material converted into an etch stop.

Description of Related Art

Integrated circuit devices use transistors for many different functions, and these transistors can take many different forms, from planar transistors, to transistors that use a "fin" style structure. A fin of a fin-type transistor is a thin, long, six-sided rectangle that extends from a substrate, with sides that are longer than they are wide, a top and bottom that have the same length as the sides (but that have a width that is much more narrow), and ends that are as tall from the substrate as the width of the sides, but that are only as wide as the as the top and bottom. Such devices find many uses.

SUMMARY

Exemplary methods herein pattern gate structures (e.g., silicon dummy gates) on a first layer and form a spacer layer (e.g., insulator layer) on the gate structures and the first layer. For example, such a "first layer" can be a silicon semiconductor substrate, with or without an insulator layer formed thereon, etc. (where such an overlying insulator layer could be used as a gate insulator, etc.). The examples presented herein use three of these gate structures, where the third of such gate structures is between the first and the second of such gate structures.

Further, the methods herein form a first photolithographic mask over some of the gate structures, and more accurately form the first mask on the spacer layer that is on the gate structures and the first layer. Such a mask is photolithographically patterned to leave the spacer layer on the first gate structure and an area of the first layer laterally adjacent the first gate structure exposed, but to cover the spacer layer on second and third gate structures and the areas of the first layer laterally adjacent to the second and third gate structures.

With the first mask patterned and in place, methods herein remove the spacer layer from the area of the first layer adjacent the first gate structure, and then remove the first mask. For example, the spacer layer can be removed in an anisotropic etching (e.g., directional etching) process that removes material from horizontal surfaces at a much higher rate than from vertical surfaces. Such anisotropic etching removes the spacer layer from the first layer (which is arbitrarily "horizontal" in this example) but leaves the spacer layer mostly intact along the sidewalls of the exposed first gate structure (which sidewalls are arbitrarily "vertical" in this example).

With the first mask removed and the area of the first layer laterally adjacent the first gate structure exposed, these methods epitaxially grow first source/drain structures on the area of the first layer laterally adjacent the first gate structure, and epitaxially grow a first cap layer on the first source/drain structures.

Then, such methods convert the first cap layer into a first etch stop layer in a decoupled plasma processes. For example, such a decoupled plasma processes could be a decoupled plasma oxidation (DPO) process or a decoupled plasma nitridation (DPN) process. In on example, such processing applies an oxygen, nitrogen, or ammonia plasma. Thus, the first cap layer can be, for example epitaxially grown silicon, and the conversion process can convert the first cap layer into a silicon nitride/oxide etch stop layer. The decoupled plasma processing only converts the first cap layer and does not affect the spacer layer, or elements protected (covered) by the spacer layer.

In a similar manner, these methods form/pattern a second photolithographic mask on the spacer layer over some of the gate structures to leave the second gate structure and an area of the first layer laterally adjacent the second gate structure exposed, and to cover the spacer layer over the first gate structure and the third gate structure and adjacent structures (e.g., the first layer, the source/drain structures, etc.). With the second mask in place, the same directional etching is used to remove the spacer layer from the area of the first layer adjacent the second gate structure. The second mask is then removed, second source/drain structures are epitaxially grown on the area of the first layer laterally adjacent the second gate structure, a second cap layer is epitaxially grown on the second source/drain structures. Further, the same (or similar) decoupled plasma processing (DPO/DPN) is used to convert the second cap layer (e.g., epitaxial silicon) into a second etch stop layer (e.g., silicon nitride/oxide).

An inter-layer dielectric layer is then formed. Following this, the dummy gates are removed and replaced with gate conductors. Additionally, these methods form contacts through the inter-layer dielectric to the first and second source/drain structures (the contacts are formed through the first and second etch stop layers). No electrical connections are formed to the third gate structure, thus the third gate structure and the spacer layer on the third gate structure form an isolation structure between the complementary transistors formed using the first gate structure and the second gate structure.

Such processing produces integrated circuit structures herein, which include complementary transistors on a first layer. Such complementary transistors comprise N-type field effect transistors (NFETs) and P-type field effect transistors (PFETs) separated by an isolation fin structure between the complementary transistors. Each of the complementary transistors includes source/drain regions and a gate conductor between the source/drain regions. The source/drains in the NFET are different from (have different impurities relative to) the source/drains in the PFET. The source/drain regions are epitaxially grown and therefore have an epitaxial growth pattern structure. Further, insulating spacers are located between the gate conductor and the source/drain regions in each of the complementary transistors.

These structures additionally include a nitride etch stop layer that is only on the source/drain regions and that does not contact the area of the isolation fin structure. In greater detail, the nitride etch stop layer is positioned only along one corner of the source/drain regions, such that the nitride etch stop layer is positioned only along a first (e.g., horizontal) surface of the first and second source/drain regions extending from the insulating spacers of the complementary transistors, and a second (e.g., vertical) surface of the source/drain regions that is perpendicular to the first surface and that is distal to the insulating spacers (where the first surface intersects the second surface at a corner of the source/drain regions).

Further, such structures include an inter-layer dielectric on the nitride etch stop layer and the isolation fin structure. The inter-layer dielectric directly contacts the isolation fin structure, and the nitride etch stop layer is between the inter-layer dielectric and the source/drain regions. The isolation fin structure has one of the gate conductors between insulating spacers, and the inter-layer dielectric directly contacts the spacers of the isolation fin structure. Additionally, conductive contacts extend through the nitride etch stop layer to the source/drain regions.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, some transistors are formed using fin structures. For example, some transistors are formed by patterning a layer (e.g., silicon layer over a semiconductor substrate) into fins (e.g., dummy fins). Various other transistor components (channel, gate insulator, source/drain structures, etc.) are formed, after which an inter-layer dielectric is formed to cover the structures. Following this, gate conductors are substituted for the original dummy gates, and conductive contacts are formed through the inter-layer dielectric to components such as the source/drain structures. Many times, epitaxial growth processes are used to form transistor components, because such processing does not require the utilization of patterning masks, which allows the epitaxially grown structures to be "self-aligned" with the structures on which they are grown.

There are some issues that are encountered during such processing. For example, if the dummy gate pitch is too small, this can significantly degrade epitaxial growth. To address this problem, often various hardmasks and liner layers are formed to promote epitaxial growth. However, this adds processing steps to form the different hardmasks and liners. Further, when the hardmasks and liners are removed, the epitaxially grown structures can be damaged, decreasing yield.

In order to address the foregoing, the structures and methods herein avoid forming liners for masks that are conventionally used to promote epitaxial growth, and thereby avoid stripping processes needed for such liners. Thus, the method herein form structures to include epitaxially grown source/drain regions and epitaxially grown etch stop layers (without source/drain-specific masks or associated liners in place). Further, such processing converts the epitaxially grown etch stop layer into a nitride/oxide etch stop layer using decoupled plasma processing to reduce the risk of future damage to any exposed epitaxial layer. Because of such processing, the etch stop layers are only formed on the source/drain structures, and are not present in other regions, such as in isolation regions between the complementary transistors.

Figure 1:
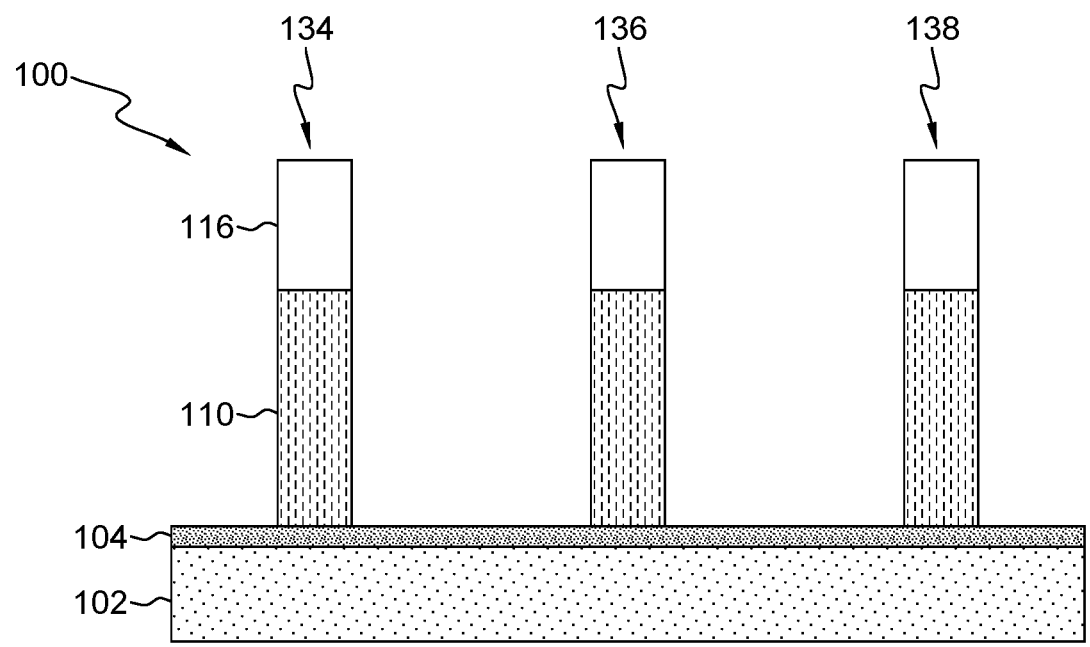
FIGS. 1-10 are schematic conceptual cross-sectional diagrams illustrating transistor structures according to embodiments herein.

More specifically, as shown conceptually in the cross-sectional schematic drawings in FIGS. 1-9, exemplary methods herein form integrated circuit structures 100 by initially patterning gate structures 134-138 (e.g., silicon dummy gates 110 with protective nitride caps 116) on a first layer 102 (e.g., FIG. 1). Such a first layer 102 can be a silicon semiconductor substrate, with or without an insulator layer 104 formed thereon, etc. (where such an overlying insulator layer 104 could be used as a gate insulator, etc.).

The examples presented herein use three of these gate structures 134-138, where the arbitrarily named "third" 136 of such gate structures is between the arbitrarily named "first" 138 and "second" 134 of such gate structures. Such three gate structures 134, 136, and 138 form a single pair of complementary transistors (two complementary transistors 134, 138 separated by an isolation structure 136). However, while only a single pair of complementary transistors is illustrated, those ordinarily skilled in the art would understand that many of such pairs of complementary transistors are formed simultaneously using the processing described herein; and only one of such three fin structures is illustrated in the drawings to avoid clutter and show greater details of the processing/structures herein.

Figure 2:
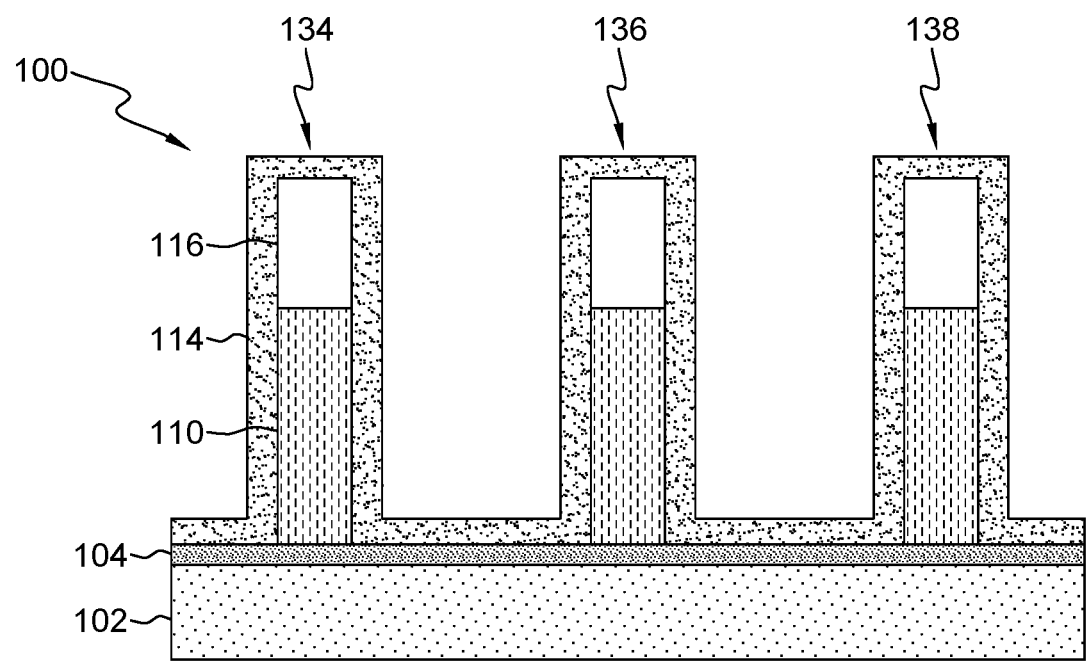
Figure 3:
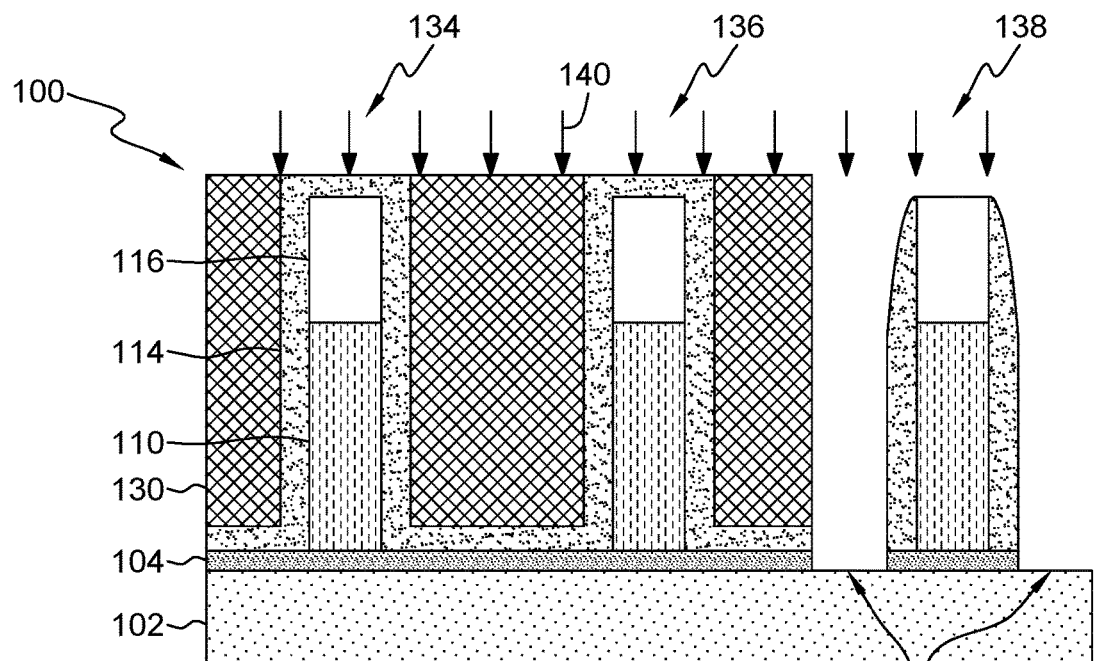

As shown in FIG. 2, such methods form a spacer layer 114 (e.g., insulator layer) on the gate structures 134-138 and the first layer 102. The spacer layer 114 can be conformally deposited, grown, etc. As shown in FIG. 3, the methods herein form/pattern a first photolithographic mask over some of the gate structures. More accurately, this processing forms the first mask 130 on the spacer layer 114 that is on the gate structures 134, 136 and the first layer 102. Such a mask is photolithographically patterned to leave the spacer layer 114 on the first gate structure 138 and an area 144 of the first layer 102 laterally adjacent the first gate structure 138 exposed, but to cover the spacer layer 114 on second and third gate structures 134, 136 and the areas of the first layer 102 laterally adjacent to the second and third gate structures 134, 136.

As also shown in FIG. 3, with the first mask 130 patterned and in place, methods herein remove the spacer layer 114 from the areas 144 of the first layer 102 adjacent the first gate structure 138 (using an etching process shown as arrows 140), and then remove the first mask 130. For example, the spacer layer 114 can be removed in an anisotropic etching (e.g., directional etching) process 140 that removes material from horizontal surfaces at a much higher rate than from vertical surfaces. Such anisotropic etching 140 removes the spacer layer 114 from the first layer 102 (which is arbitrarily referred to as "horizontal" in this example) but leaves the spacer layer 114 mostly intact along the sidewalls of the exposed first gate structure 138 (which sidewalls are arbitrarily referred to as "vertical" in this example, where horizontal surfaces are perpendicular to vertical surfaces). The result of the directional etching can be seen in FIG. 3 where the spacer layer 114 begins to thin as the sidewall spacers 114 reach the top of the first gate structure 138.

Figure 4:
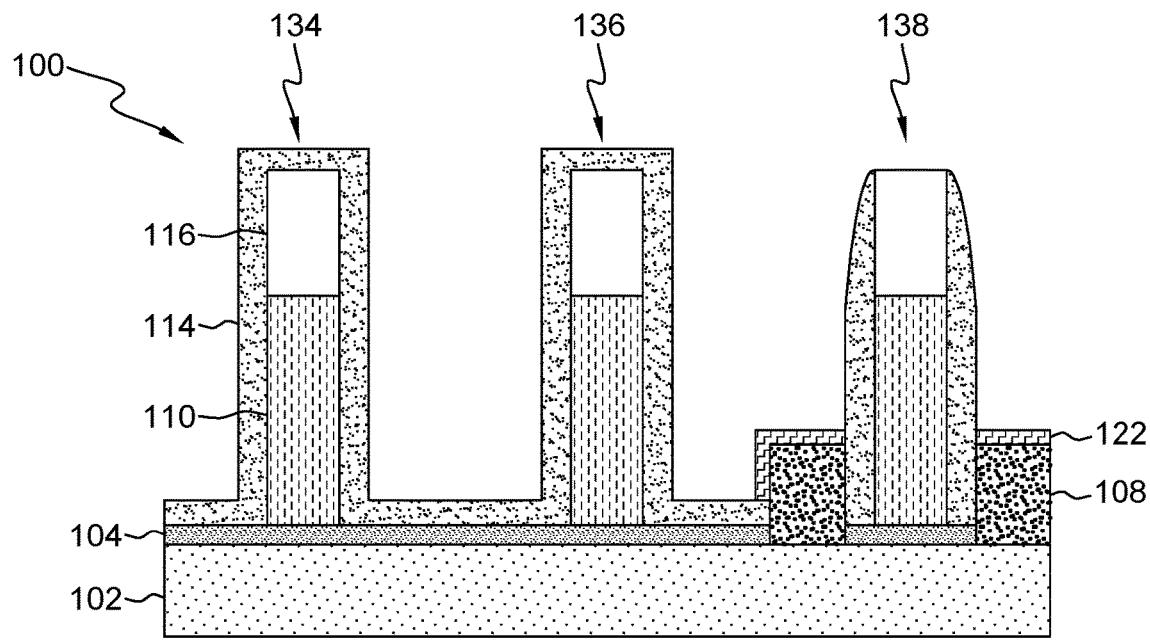

With the first mask 130 removed and the area 144 of the first layer 102 laterally adjacent the first gate structure 138 exposed, as shown in FIG. 4, these methods epitaxially grow first source/drain structures 108 on the area 144 of the first layer 102 laterally adjacent the first gate structure 138. This epitaxial growth process uses heating in an impurity-rich environment to grow doped material, using the opposite polarity dopants/impurities than will be used for the complementary transistor's source/drain regions. Note that this processing produces self-aligned source/drain structures that are automatically limited by (and automatically aligned by) the remaining insulator of the spacer layer 114, eliminating the need for additional masking or liner layers.

Figure 5:
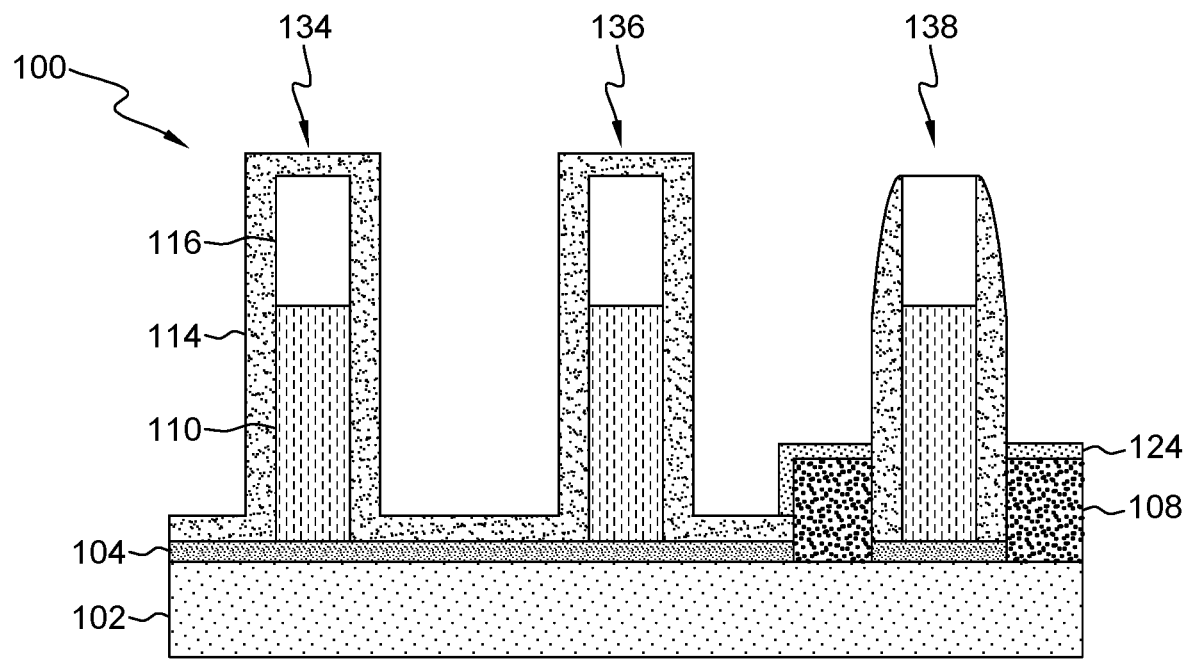

Following this, as also shown in FIG. 4, such methods epitaxially grow a first cap layer 122 on the first source/drain structures 108. The first cap layer 122 may be grown in an impurity-free environment to grow pure silicon, or other materials that are useful as etch stop layers. Then, as shown in FIG. 5, such methods convert the first cap layer 122 into a first etch stop layer 124 in a decoupled plasma processes. Thus, the first cap layer 122 can be, for example, epitaxially grown silicon, and the conversion process can convert the first cap layer 122 into a silicon nitride/oxide etch stop layer 124. The decoupled plasma processing only converts the first cap layer 122 and does not affect the spacer layer 114, or elements protected (covered) by the spacer layer 114.

For example, such a decoupled plasma processes could be a decoupled plasma oxidation (DPO) process or a decoupled plasma nitridation (DPN) process, or any other similar process. In one example, such processing applies an oxygen ($O_2$), nitrogen ($N_2$), or ammonia ($NH_3$) plasma at temperatures between 20° C. and 450° C., at a radio frequency (RF) power between 2-3 kW (potentially pulsed between 2% and 70%), using a chuck powered between 400-600V, etc.

Figure 6:
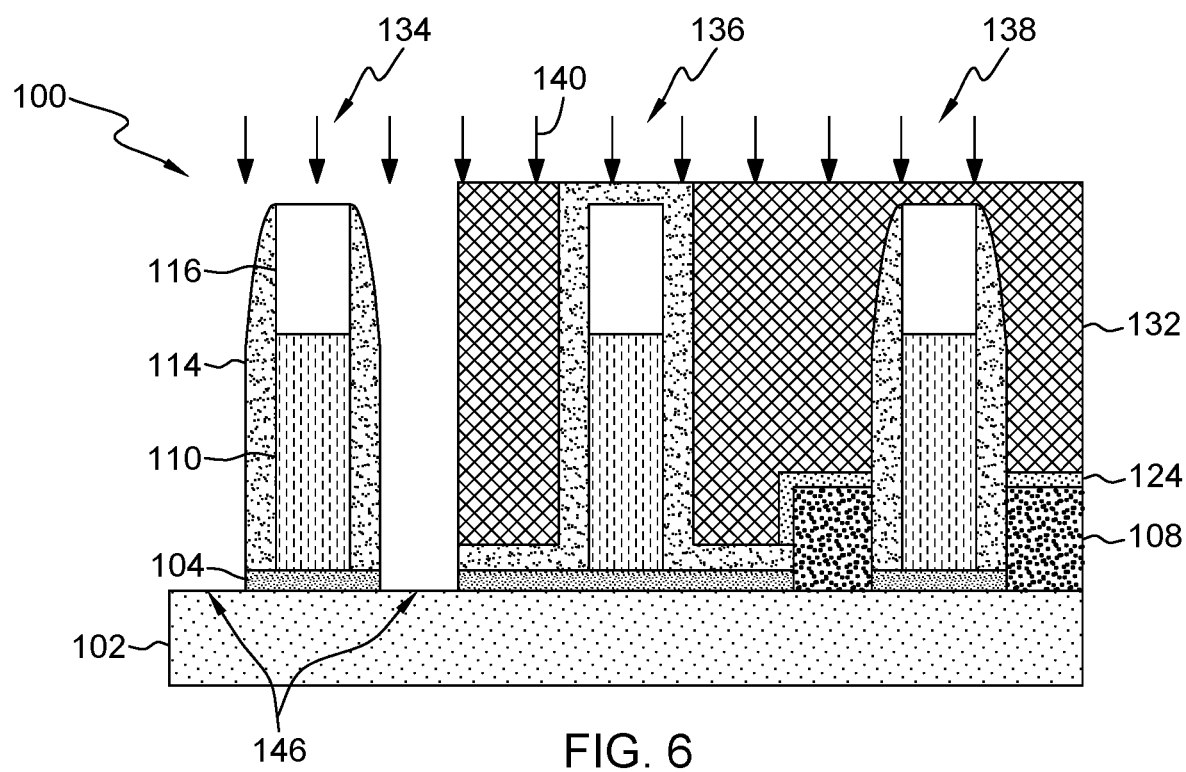

In a similar manner, as shown in FIG. 6, these methods form/pattern a second photolithographic mask on the spacer layer 114 over some of the gate structures to leave the second gate structure 136 and an area 146 of the first layer 102 laterally adjacent the second gate structure 136 exposed, and to cover the spacer layer 114 over the first gate structure 138 and the third gate structure 136 and adjacent structures (e.g., the first layer 102, the source/drain structures, etc.). With the second mask 132 in place, the same directional etching 140 described above is used to remove the spacer layer 114 from the area 146 of the first layer 102 adjacent the second gate structure 136, as shown in FIG. 6. The second mask 132 is then removed. Note that because the first cap layer 122 has been previously converted to a nitride/oxide etch stop layer 124 at this point in the processing, it is not damaged by the removal/stripping of the second mask 132.

Figure 7:
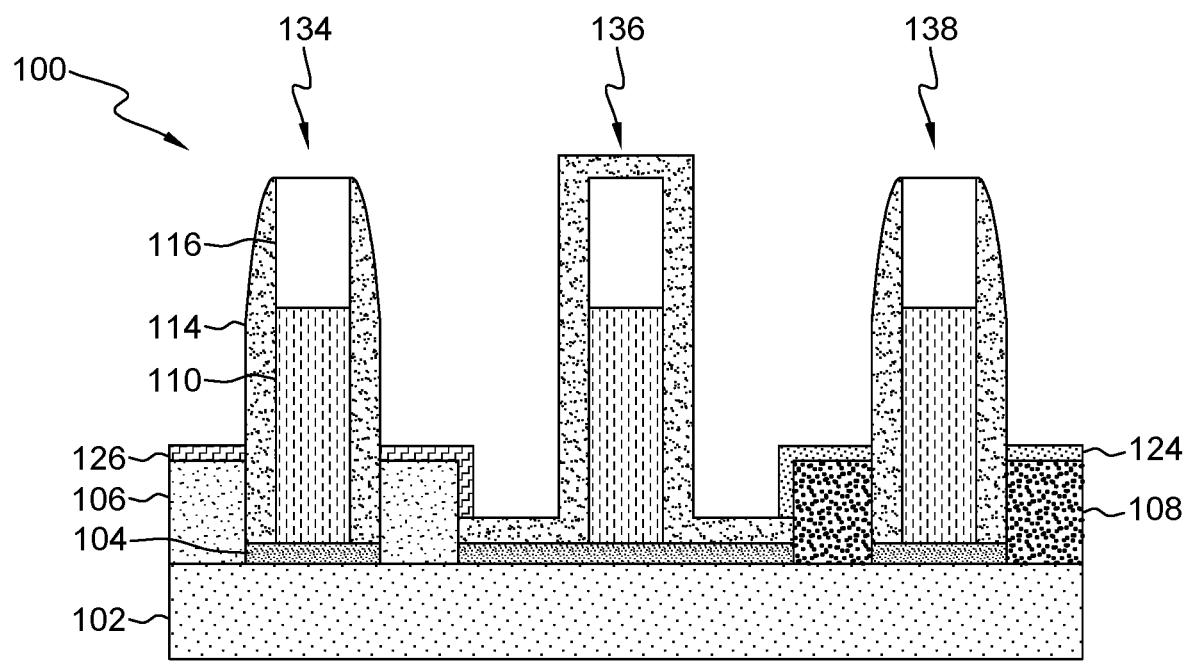
Figure 8:
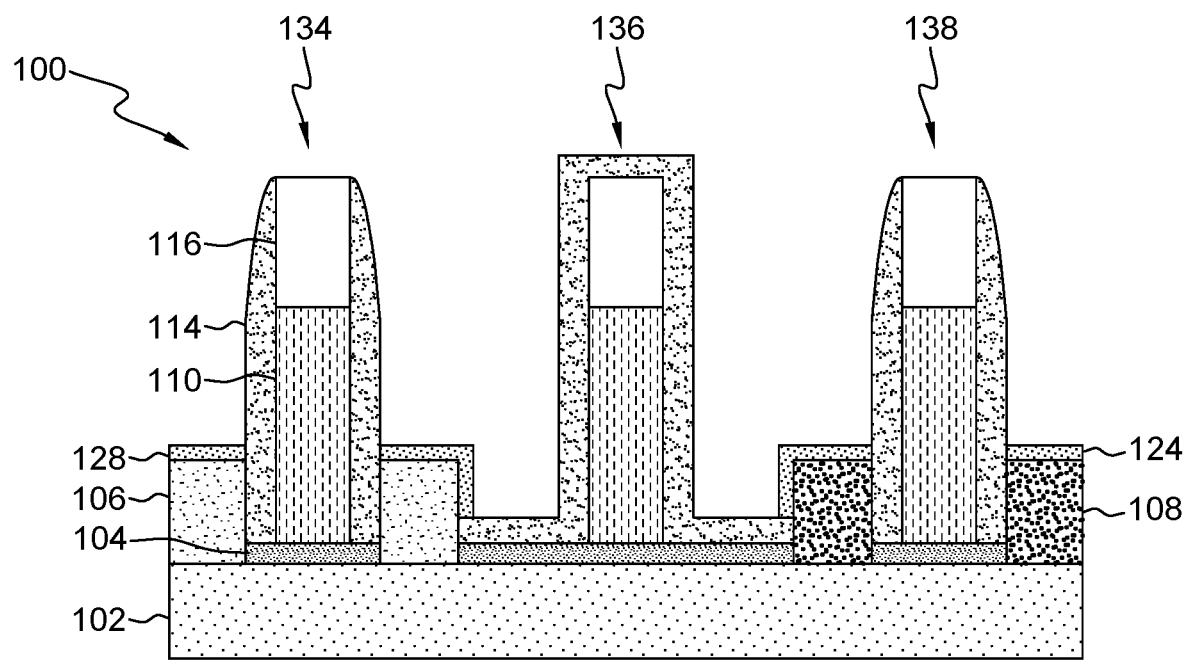
Figure 9:
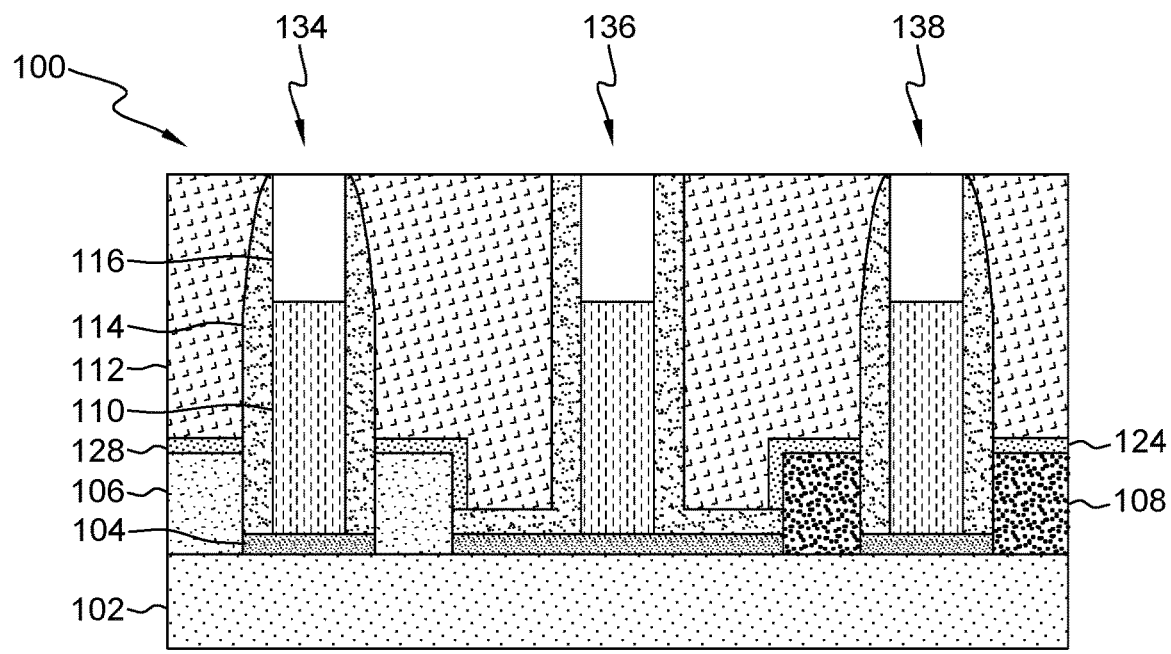

As shown in FIG. 7, using similar processing as describe above (but using different dopants and/or different doping concentrations) second source/drain structures 106 are epitaxially grown on the area 146 of the first layer 102 laterally adjacent the second gate structure 136, and again a second cap layer 126 is epitaxially grown on the second source/drain structures 106. Further, as shown in FIG. 8, the same (or similar) decoupled plasma processing (DPO/DPN) is used to convert the second cap layer 126 (e.g., epitaxial silicon) into a second etch stop layer 128 (e.g., silicon nitride/oxide).

Figure 10:
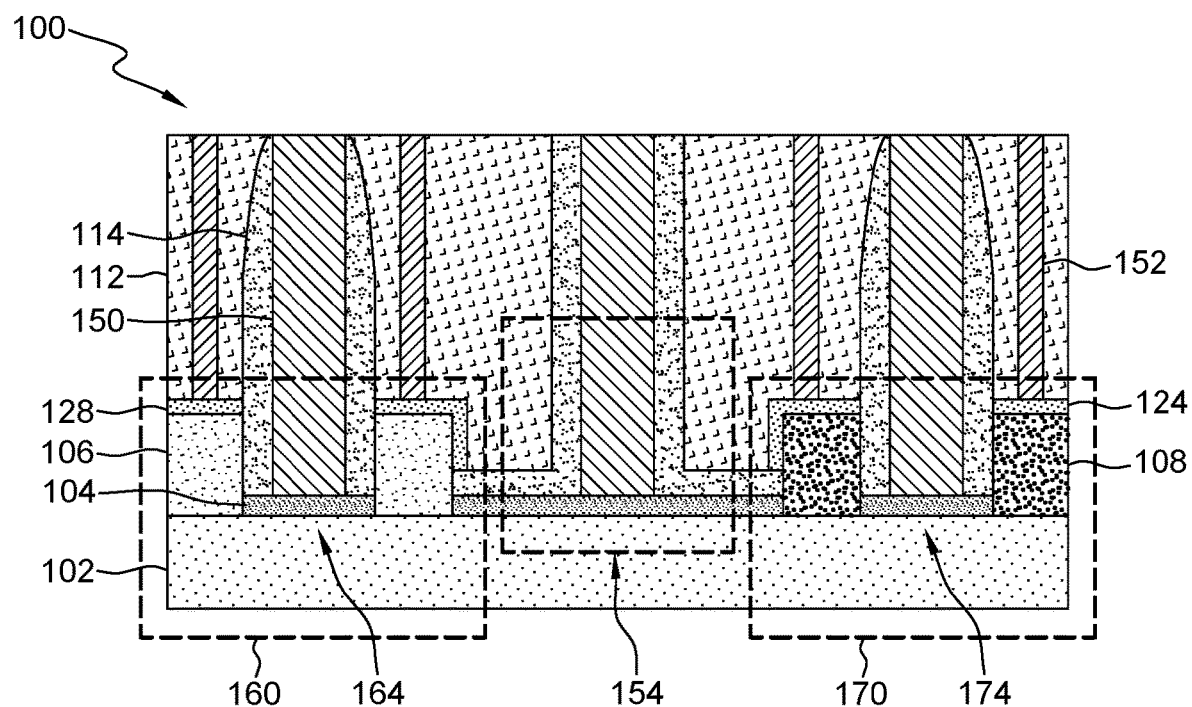

An inter-layer dielectric layer 112 is then formed (e.g., deposited, grown, etc.) over the entire structure, and then planarized. Following this, as shown in FIG. 10, the dummy gates 110/116 are removed and replaced with gate conductors 150 (e.g., using selective removal processes to only remove dummy gates 110/116 and leave openings, which then are filled with a conductor). Additionally, these methods form contacts 152 through the inter-layer dielectric 112 to the first and second source/drain structures 106, 108. The contacts 152 are formed by forming (patterning) openings (vias) in the inter-layer dielectric 112 to/through the first and second etch stop layers 124, 128; and when such etch layers 124, 128 are detected, the process of forming such openings for the contacts 152 is stopped to avoid removing portions of the source/drain structures 106, 108. After the via openings are patterned in the inter-layer dielectric 112, they are filled with a conductor to form the contacts 152. No electrical connections are formed to the third gate structure 136, and thus the third gate structure 136 and the spacer layer 114 on the third gate structure 136 form an isolation structure 154 between the complementary transistors 160, 170 formed using the first gate structure 138 and the second gate structure 136.

Such processing produces integrated circuit structures, such as that shown in FIG. 10, which include complementary transistors 160, 170 on a first layer 102. Such complementary transistors comprise N-type field effect transistors (NFETs) 160 and P-type field effect transistors (PFETs) 170 separated by an isolation fin structure 154 between the complementary transistors 160, 170. Each of the complementary transistors 160, 170 includes source/drain regions 106, 108, a gate conductor 150 between the source/drain regions 106, 108, and a channel region 164, 174 in the first layer 102 below the gate conductor 150. The channel regions 164, 174 are insulated from the gate conductors 150 by the gate oxide 104. The source/drains 106 in the NFET 160 are different from (have different impurities relative to) the source/drains 108 in the PFET 170. The source/drain regions 106, 108 are epitaxially grown and therefore have an epitaxial growth pattern structure. Further, insulating sidewall spacers 114 are located between the gate conductors 150 and the source/drain regions 106, 108 in each of the complementary transistors 160, 170.

These structures additionally include a nitride/oxide etch stop layer 124, 128 (e.g., contact etch stop layer (CESL)) that is only on the source/drain regions 106, 108 and that does not contact the area of the isolation fin structure 154. The area of the isolation fin structure 154 includes the gate conductor 150 of the isolation fin structure, the vertical portion of the spacer layer 114 on the sidewalls of the gate conductor 150, and the portion of the spacer layer 114 extending from the isolation fin structure 154 approximately half-way to the source drain regions 106, 108 of the complementary transistors 160, 170. In greater detail, the nitride/oxide etch stop layer 124, 128 is positioned only along one corner of each of the source/drain regions 106, 108, such that the nitride etch stop layer 124, 128 is positioned only along a first (e.g., horizontal) surface of the first and second source/drain regions 106, 108 extending from the insulating sidewall spacers 114 of the complementary transistors 160, 170, and a second (e.g., vertical) surface of the source/drain regions 106, 108 that is perpendicular to the first surface and that is distal to the insulating sidewall spacers 114 (where such a "first" surface intersects the "second" surface at a corner of the source/drain regions 106, 108).

Further, such structures include an inter-layer dielectric 112 on the nitride etch stop layer 124, 128 and the isolation fin structure 154. The inter-layer dielectric 112 directly contacts the horizontal portions of the insulating spacer 114 of the isolation fin structure 154, and the nitride etch stop layer 124, 128 is between the inter-layer dielectric 112 and the source/drain regions 106, 108. The isolation fin structure 154 has one of the gate conductors 150 between insulating sidewall spacers 114, and the inter-layer dielectric 112 directly contacts the insulating spacers 114 of the isolation fin structure 154. Additionally, conductive contacts 152 extend through the inter-layer dielectric 112 and nitride etch stop layer 124, 128 to the source/drain regions 106, 108.

Figure 11:
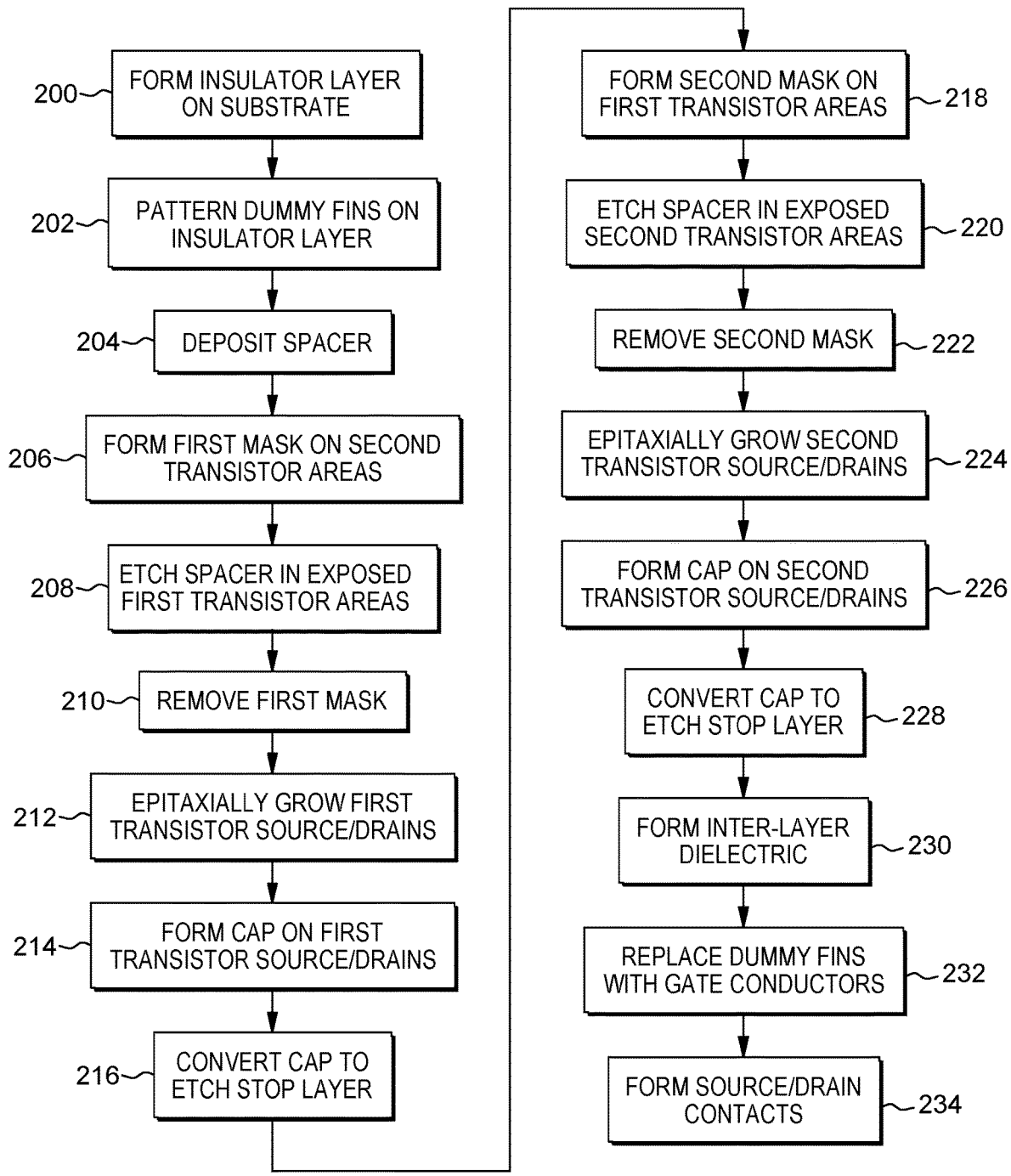
FIG. 11 is a flow diagram illustrating embodiments herein.

The method as described above is shown in flowchart form in FIG. 11. More specifically, in item 200, such methods form an insulator layer on a first layer (such as an oxide on a semiconductor substrate). In item 202, these methods pattern gate structures (e.g., silicon dummy fins, dummy gates) on a first layer and form a spacer layer (e.g., insulator layer) on the gate structures and the first layer in item 204. The examples presented herein use three of these gate structures, where the third of such gate structures is between the first and the second of such gate structures.

Further, in item 206, the methods herein form a first photolithographic mask over some of the gate structures, and more accurately form the first mask on the spacer layer that is on the gate structures and the first layer. Such a mask is photolithographically patterned in item 206 to leave the spacer layer on the first gate structure and an area of the first layer laterally adjacent the first gate structure exposed, but to cover the spacer layer on second and third gate structures and the areas of the first layer laterally adjacent to the second and third gate structures.

With the first mask patterned and in place, in item 208 such methods remove the spacer layer from the area of the first layer adjacent the first gate structure, and then remove the first mask in item 210. For example, the spacer layer can be removed in an anisotropic etching (e.g., directional etching) process that removes material from horizontal surfaces at a much higher rate than from vertical surfaces. Such anisotropic etching removes the spacer layer from the first layer (which is arbitrarily termed "horizontal" in this example) but leaves the spacer layer mostly intact along the sidewalls of the exposed first gate structure (which sidewalls are arbitrarily "vertical" (perpendicular to horizontal) in this example).

With the first mask removed in item 210 and the area of the first layer laterally adjacent the first gate structure exposed from the etching in item 208 (leaving only sidewall spacers on the first gate structure) in item 212, these methods epitaxially grow first source/drain structures on the area of the first layer laterally adjacent the first gate structure, and epitaxially grow a first cap layer on the first source/drain structures in item 214. As noted above, such epitaxial growth processing uses opposite polarity dopants than will be used for the complementary transistor's source/drain regions. Also, the first cap layer may be grown in an impurity-free environment to grow pure silicon, or other materials that are useful as etch stop layers after conversion. Note that this processing produces self-aligned source/drain structures and cap layer as limited by the remaining insulator of the spacer layer, eliminating the need for additional masking or liner layers.

Then, in item 216 such methods convert the first cap layer into a different material that forms a first etch stop layer in a decoupled plasma processes. For example, such a decoupled plasma processes could be a decoupled plasma oxidation (DPO) process or a decoupled plasma nitridation (DPN) process. In one example, such processing applies an oxygen, nitrogen, or ammonia plasma. Thus, the first cap layer can be, for example epitaxially grown silicon, and the conversion process can convert the first cap layer into a silicon nitride/oxide etch stop layer. The decoupled plasma processing in item 216 only converts the first cap layer and does not affect the spacer layer, or elements protected (covered) by the spacer layer.

In a similar manner, these methods form/pattern a second photolithographic mask on the spacer layer over some of the gate structures in item 218 to leave the second gate structure and an area of the first layer laterally adjacent the second gate structure exposed, and to cover the spacer layer over the first gate structure and the third gate structure and adjacent structures (e.g., the first layer, the source/drain structures, etc.). With the second mask in place, the same directional etching is used in item 220 to remove the spacer layer from the area of the first layer adjacent the second gate structure, leaving only sidewall spacers on the second gate structure.

The second mask is then removed in item 222. Again, because the first cap layer has been previously converted to a nitride/oxide etch stop layer in item 216, at this point in the processing, it is not damaged by the removal/stripping of the second mask in item 222. Second source/drain structures are epitaxially grown on the area of the first layer laterally adjacent the second gate structure in item 224, using identical processing used in item 212 except that an opposite polarity and/or different dopant concentration is used relative to the processing in item 212. Using the same processing as in item 214, a second cap layer is epitaxially grown on the second source/drain structures in item 226. In a similar manner to the processing in item 216, the same (or similar) decoupled plasma processing (DPO/DPN) is used to convert the second cap layer (e.g., epitaxial silicon) into a second etch stop layer (e.g., silicon nitride/oxide) in item 228.

An inter-layer dielectric layer is then formed in item 230. Following this, the dummy gates are removed and replaced with gate conductors in item 232. Additionally, in item 234 these methods form contacts through the inter-layer dielectric to the first and second source/drain structures (the contacts are formed to/through the first and second etch stop layers). No electrical connections are formed to the third gate structure, thus the third gate structure and the spacer layer on the third gate structure form an isolation structure between the complementary transistors formed using the first gate structure and the second gate structure.

For purposes herein, a "semiconductor" is a material or structure that may include an implanted or in situ (e.g., epitaxially grown) impurity that allows the material to sometimes be a conductor and sometimes be an insulator, based on electron and hole carrier concentration. As used herein, "implantation processes" can take any appropriate form (whether now known or developed in the future) and can be, for example, ion implantation, etc. Epitaxial growth occurs in a heated (and sometimes pressurized) environment that is rich with a gas of the material that is to be grown.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

There are various types of transistors, which have slight differences in how they are used in a circuit. For example, a bipolar transistor has terminals labeled base, collector, and emitter. A small current at the base terminal (that is, flowing between the base and the emitter) can control, or switch, a much larger current between the collector and emitter terminals. Another example is a field-effect transistor, which has terminals labeled gate, source, and drain. A voltage at the gate can control a current between source and drain. Within such transistors, a semiconductor (channel region) is positioned between the conductive source region and the similarly conductive drain (or conductive source/emitter regions), and when the semiconductor is in a conductive state, the semiconductor allows electrical current to flow between the source and drain, or collector and emitter. The gate is a conductive element that is electrically separated from the semiconductor by a "gate oxide" (which is an insulator); and current/voltage within the gate changes makes the channel region conductive, allowing electrical current to flow between the source and drain. Similarly, current flowing between the base and the emitter makes the semiconductor conductive, allowing current to flow between the collector and emitter.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

Generally, transistor structures are formed by depositing or implanting impurities into a substrate to form at least one semiconductor channel region, bordered by shallow trench isolation regions below the top (upper) surface of the substrate. A "substrate" herein can be any material appropriate for the given purpose (whether now known or developed in the future) and can be, for example, silicon-based wafers (bulk materials), ceramic materials, organic materials, oxide materials, nitride materials, etc., whether doped or undoped. The "shallow trench isolation" (STI) structures are generally formed by patterning openings/trenches within the substrate and growing or filling the openings with a highly insulating material (this allows different active areas of the substrate to be electrically isolated from one another).

A hardmask can be formed of any suitable material, whether now known or developed in the future, such as a nitride, metal, or organic hardmask, that has a hardness greater than the substrate and insulator materials used in the remainder of the structure. When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., wet etching, anisotropic etching (orientation dependent etching), plasma etching (reactive ion etching (RIE), etc.)) to remove the unprotected portions of the material below the resist to be patterned. The resist is subsequently removed to leave the underlying material patterned according to the light exposure pattern (or a negative image thereof).

For purposes herein, "sidewall spacers" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

The flowchart and block diagrams in the figures illustrate the architecture, functionality, and operation of possible implementations of devices and methods according to various embodiments. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. An integrated circuit structure comprising:
   complementary transistors on a first layer;
   an isolation structure between the complementary transistors, wherein each of the complementary transistors includes source/drain regions and a gate conductor between the source/drain regions, and wherein insulating spacers are between the gate conductor and the source/drain regions in each of the complementary transistors;
   a horizontal spacer extending parallel to the first layer from the isolation structure to the source/drain regions; and
   an etch stop layer extending from the insulating spacers and extending along the source/drain regions, wherein the etch stop layer does not extend along an entirety of the horizontal spacer.

2. The integrated circuit structure in claim 1, further comprising an inter-layer dielectric on the etch stop layer and the isolation structure, wherein the inter-layer dielectric directly contacts the isolation structure, and wherein the etch stop layer is between the inter-layer dielectric and the source/drain regions.

3. The integrated circuit structure in claim 2, wherein the gate conductor between the insulating spacers is additionally within the isolation structure, and the inter-layer dielectric directly contacts the insulating spacers of the isolation structure.

4. The integrated circuit structure in claim 1, wherein the etch stop layer is positioned along a first surface of the source/drain regions extending from the insulating spacers of the complementary transistors, and a second surface of the source/drain regions that is perpendicular to the first surface and that is distal to the insulating spacers.

5. The integrated circuit structure in claim 1, further comprising conductive contacts extending through the etch stop layer to the source/drain regions.

6. The integrated circuit structure in claim 1, wherein the source/drain regions have an epitaxial growth pattern structure.

7. An integrated circuit structure comprising:
   complementary transistors on a first layer, wherein the complementary transistors comprise one N-type field effect transistor (NFET) and one P-type field effect transistor (PFET);
   an isolation fin between the complementary transistors, wherein each of the complementary transistors includes source/drain regions and a gate conductor between the source/drain regions, wherein the source/drain regions in the NFET are different from the source/drain regions in the PFET, and wherein insulating spacers are between the gate conductor and the source/drain regions in each of the complementary transistors;
   a horizontal spacer extending parallel to the first layer from the isolation fin to the source/drain regions; and
   an etch stop layer extending from the insulating spacers and extending along the source/drain regions, wherein the etch stop layer does not extend along an entirety of the horizontal spacer.

8. The integrated circuit structure in claim 7, further comprising an inter-layer dielectric on the etch stop layer and the isolation fin, wherein the inter-layer dielectric directly contacts the isolation fin, and wherein the etch stop layer is between the inter-layer dielectric and the source/drain regions.

9. The integrated circuit structure in claim 8, wherein the gate conductor between the insulating spacers is additionally within the isolation fin, and the inter-layer dielectric directly contacts the insulating spacers of the isolation fin.

10. The integrated circuit structure in claim 7, wherein the etch stop layer is positioned along a first surface of the source/drain regions extending from the insulating spacers of the complementary transistors, and a second surface of the source/drain regions that is perpendicular to the first surface and that is distal to the insulating spacers.

11. The integrated circuit structure in claim 7, further comprising conductive contacts extending through the etch stop layer to the source/drain regions.

12. The integrated circuit structure in claim 7, wherein the source/drain regions have an epitaxial growth pattern structure.

13. An integrated circuit structure comprising:
   complementary transistors on a first layer;
   an isolation structure between the complementary transistors, wherein each of the complementary transistors includes source/drain regions and a gate conductor between the source/drain regions, wherein first insulating spacers are between the gate conductor and the source/drain regions in each of the complementary transistors, and wherein the isolation structure includes an isolation fin parallel to the gate conductors;
   second insulating spacers on the isolation fin, wherein the second insulating spacers include a vertical spacer along sides of the isolation fin and a horizontal spacer extending parallel to the first layer between the isolation fin and the source/drain regions; and
   an etch stop layer extending from and contacting the first insulating spacers and extending along the source/drain regions, wherein the etch stop layer does not extend along an entirety of the horizontal spacer.

14. The integrated circuit structure in claim 13, further comprising an inter-layer dielectric on the etch stop layer and the isolation structure, wherein the inter-layer dielectric directly contacts the isolation structure, and wherein the etch stop layer is between the inter-layer dielectric and the source/drain regions.

15. The integrated circuit structure in claim 13, wherein the etch stop layer is positioned along a first surface of the source/drain regions extending from the first insulating spacers, and a second surface of the source/drain regions that is perpendicular to the first surface and that is distal to the first insulating spacers.

16. The integrated circuit structure in claim 13, further comprising conductive contacts extending through the etch stop layer to the source/drain regions.

17. The integrated circuit structure in claim 13, wherein the source/drain regions have an epitaxial growth pattern structure.

* * * * *